(12) United States Patent
Bonwick

(10) Patent No.: US 7,852,115 B2
(45) Date of Patent: Dec. 14, 2010

(54) METHOD AND APPARATUS FOR SAFE POWER UP OF PROGRAMMABLE INTERCONNECT

(75) Inventor: Paul Bonwick, Temple Quay (GB)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/608,499

(22) Filed: Oct. 29, 2009

(65) Prior Publication Data
US 2010/0117681 A1    May 13, 2010

(30) Foreign Application Priority Data
Oct. 29, 2008    (EP) .................................. 08167801

(51) Int. Cl.
*H03K 19/173* (2006.01)
(52) U.S. Cl. ......................................... 326/38; 326/46
(58) Field of Classification Search ............. 326/37–41, 326/46
See application file for complete search history.

(56) References Cited

U.S. PATENT DOCUMENTS

| 4,774,625 | A | 9/1988 | Yamanaka |
| 6,185,126 | B1 | 2/2001 | Rodgers et al. |
| 2004/0210696 | A1 | 10/2004 | Meyer et al. |
| 2004/0251930 | A1* | 12/2004 | Ngai et al. ..................... 326/41 |
| 2007/0007999 | A1* | 1/2007 | Graham et al. ................. 326/38 |

FOREIGN PATENT DOCUMENTS

| DE | 35 38214 A1 | 7/1986 |
| EP | 0 573 317 A1 | 12/1993 |

OTHER PUBLICATIONS

European Search Report issued in European Patent Application No. EP 08 16 7801, dated Mar. 27, 2009.

\* cited by examiner

*Primary Examiner*—Don P Le
(74) *Attorney, Agent, or Firm*—McDermott Will & Emery LLP

(57) ABSTRACT

A method and apparatus for connecting a load track (3) of a programmable interconnect to a plurality of intersecting driver tracks (2) of the programmable interconnect. The apparatus comprises a chain of connection cells (9;15), each connection cell being operable to connect the load track of the programmable interconnect to an associated intersecting driver track. Each cell also comprises connection signal receiving means arranged to receive a connection signal and activation signal receiving means arranged to receive an activation signal. The apparatus also comprises connection means arranged to connect the load track of the programmable interconnect to the associated intersecting driver track of the programmable interconnect when the connection signal receiving means has received a connection signal and the activation signal receiving means has received an activation signal. The apparatus also comprises activation signal propagating means arranged to propagate the activation signal to the next cell in the chain when the connection signal receiving means has not received a connection signal and the activation signal receiving means has received an activation signal.

8 Claims, 7 Drawing Sheets

| IN | SRAM | tgate | OUT |
|----|------|-------|-----|
| 0  | 0    | 0     | 0   |
| 0  | 1    | 0     | 0   |
| 1  | 0    | 0     | 1   |
| 1  | 1    | 1     | 0   |

METHOD AND APPARATUS FOR SAFE POWER UP OF PROGRAMMABLE INTERCONNECT

The present invention relates to the field of configurable devices comprising programmable interconnects.

Many configurable devices, such as Field Programmable Gate Arrays (FPGAs) have programmable interconnects consisting of a grid of tracks which are connected at each intersection by a transmission gate (tgate). Each transmission gate is usually controlled by a memory element such as a Static Random Access Memory (SRAM).

Typically, grids of tracks comprise of a plurality of driver tracks intersecting a plurality of load tracks. When more than one driver track is connected to a single load track, a significant amount of current can flow through the interconnect and may potentially damage sensitive elements of the circuit.

Moreover, when a configurable device is powered up, the SRAMs are likely to contain random data. Therefore, multiple transmission gates could potentially be configured as being on, thereby allowing a significant amount of current to flow through the interconnect until an initial configuration is loaded into the SRAM or the SRAM is reset.

In order to avoid this, devices have been developed which use control signals in order to restrict the activation of the transmission gates on a line. Notably, decoders can be used in order to ensure that only one transmission gate can be activated at any one time. For example, in the case where there are 4 transmission gates on a single line, a 2 to 4 decoder can be used in conjunction with 2 SRAMs connected to the two inputs of the decoder, the outputs being used as control signals for the transmission gates.

The advantage of these devices is that, regardless of the state of the two SRAMs at power up, only one of the control signals will be active and therefore only one of the transmission gates will be activated, thereby limited the amount of current flowing through the interconnect.

The abovementioned devices do however have some significant disadvantages. For example, because tracks in a single interconnect may have varying numbers of the transmission gates, each interconnect may require different decoder designs and different numbers of control signals. This is not desirable in that the different decoder requirements make the tracks less homogeneous and cause the parasitic loading of each line to be different.

Moreover, it may be desirable to design a programmable interconnect having a variable number of transmission gates. This may be due to design changes or because a given design needs to be used for a family of devices with different array sizes. In this situation however, the abovementioned devices would need to be entirely redesigned. Thus, these prior art devices are clearly not easily scalable.

Finally, the hierarchy of a given design may be such that different tracks span over several grids, each grid being different in configuration and size. Using a device in accordance with the prior art in this situation would result in a very complex and large control network.

Accordingly, there is a clear need for an improved method and device for powering up a programmable interconnect in a safe, simple and scalable way.

In order to solve the problems associated with the prior art, the present invention provides an apparatus for connecting a load track of a programmable interconnect to a plurality of intersecting driver tracks of the programmable interconnect, the apparatus comprising a chain of connection cells, each connection cell being operable to connect the load track of the programmable interconnect to an associated intersecting driver track, each cell comprises:

connection signal receiving means arranged to receive a connection signal;

activation signal receiving means arranged to receive an activation signal;

connection means arranged to connect the load track of the programmable interconnect to the associated intersecting driver track of the programmable interconnect when the connection signal receiving means has received a connection signal and the activation signal receiving means has received an activation signal; and activation signal propagating means arranged to propagate the activation signal to the next cell in the chain when the connection signal receiving means has not received a connection signal and the activation signal receiving means has received an activation signal.

The connection signal receiving means may receive a connection signal from a memory device.

The connection means may comprise a transmission gate.

The connection signal receiving means and the activation signal receiving means may comprise first and second inputs of a logical AND gate, respectively;

the output of the logical AND gate may be connected to a control input of the transmission gate and to the input of a logical inverter;

the output of the logical inverter may be connected to the first input of a second logical AND gate;

the activation signal means may be connected to the second input of the second logical AND gate; and the output of the second logical AND gate may be connected to the activation signal receiving means of the next cell in the chain.

The connection signal receiving means and the activation signal receiving means may comprise first and second inputs of a logical AND gate, respectively;

the output of the logical AND gate may be connected to a control input of the transmission gate, to the input of a logical inverter, to the gate of an P-channel transistor and to the gate of a first N-channel transistor;

the output of the logical inverter may be connected to the gate of a second N-channel transistor;

the activation signal means may be connected to the source of the P-channel transistor and to the drain of the second N-channel transistor;

the source of the first N-channel transistor may be connected to ground; and the drain of the P-channel transistor and the source of the second N-channel transistor may be connected to the drain of the first N-channel transistor and to the activation signal receiving means of the next cell in the chain.

The present invention also provides a programmable interconnect which comprises an apparatus in accordance with the above.

The present invention also provides a reconfigurable device which comprises a programmable interconnect in accordance with the above.

The present invention also provides a method of connecting a load track of a programmable interconnect to a plurality of intersecting driver tracks of the programmable interconnect, the apparatus comprising a chain of connection cells, each connection cell being operable to connect the load track of the programmable interconnect to an associated intersecting driver track, the method comprises the steps of:

receiving a connection signal;

receiving an activation signal;

connecting the load track of the programmable interconnect to the associated intersecting driver track of the programmable interconnect if the connection signal and the activation signal are at predetermined values; and propagating the activation signal to the next cell in the chain when the connection signal and the activation signal are at another predetermined value.

As will be appreciated, the present invention provides several advantages over the prior art. For example, the present invention requires no Power on Reset (POR) signal or other control. Moreover, because every transmission gate control circuit is identical, the layout can be made efficient and the parasitics on the transmission gates are constant. Also, a device in accordance with the present invention is scalable to any number of transmission gate controllers. Furthermore, the device in accordance with the present invention requires only a single track to interconnect all of the transmission gate controllers.

As will be appreciated by a person skilled in the art, complex semiconductor designs are typically composed of numerous sub-designs, each of which may comprise several logic blocks. It many circumstances, different sub-designs or blocks are designed by different engineers. The present invention facilitates the integration of different designs by being easily implemented within hierarchical cells and across hierarchical boundaries. Accordingly, it does not suffer the disadvantages associated with more complex schemes which may require many tracks and be more prone to implementation errors, requiring more verification and testing.

Specific embodiments of the present invention will now be described with reference to the accompanying drawings, in which.

Figure 1:
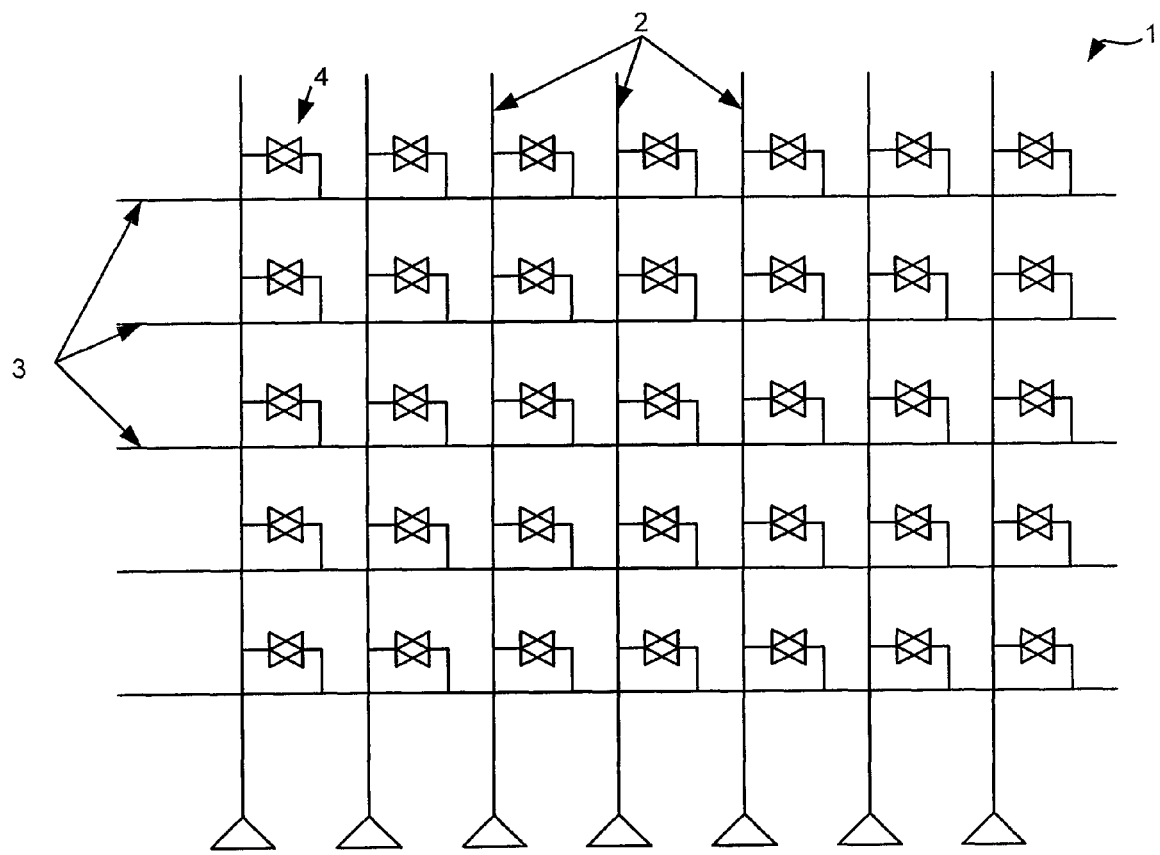
FIG. 1 is a diagram representing an interconnect in accordance with the prior art.

FIG. 1 shows a diagram representing a typical interconnect 1. The interconnect 1 comprises a grid consisting of a plurality of horizontal tracks 3 and vertical tracks 2. In this embodiment, the vertical tracks 2 are driver tracks and the horizontal tracks 3 are load tracks. A situation where more than one load track is connected to a driver track is not problematic. A situation however where more than one driver track is connected to a single load track will cause a significant amount of current to flow through the interconnect and may potentially damage sensitive elements of the circuit.

In order to connect intersecting tracks, transmission gates 4 are positioned at several intersections between horizontal tracks 3 and vertical tracks 2. In the example shown in FIG. 1, each intersection between the tracks comprises a transmission gate. As will be appreciated however, in other examples, not all intersections need comprise a transmission gate.

The transmission gates 4 are operable to connect the horizontal and vertical tracks defining the intersection at which it is placed.

As will be appreciated, most current transmission gates comprise a parallel combination of nMOS and pMOS transistors (not shown), the control of which is effectuated using two complimentary signals. For the purposes of clarity however, a single control signal will be used throughout the description, the complement of which being easily provided by known methods.

Figure 2:
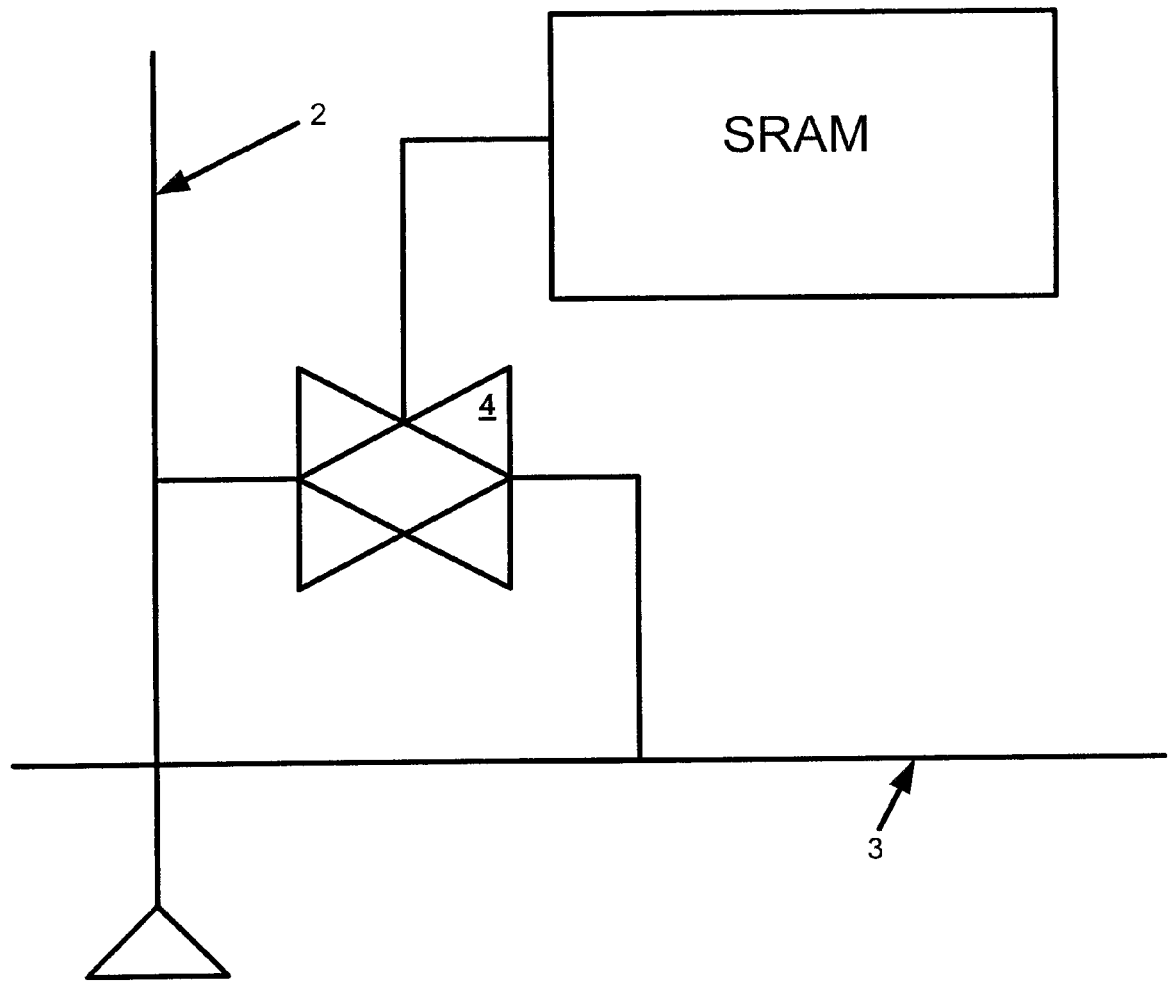
FIG. 2 is a diagram representing a transmission gate in accordance with the prior art.

FIG. 2 shows a diagram representing a single transmission gate 4 in accordance with the prior art. The transmission gate 4 in this example is controlled by a control signal coming from a memory module (SRAM). For example, if a 1 (i.e. logical HIGH) is stored in the SRAM, then the transmission gate will connect the horizontal track 3 to the vertical track 2. If however a 0 (i.e. logical LOW) is stored in the SRAM, then the transmission gate will disconnect the horizontal track 3 from the vertical track 2. Accordingly, the value which is stored in the SRAM will control the activation of the transmission gate.

When a device is powered up, each SRAM (or each address in an SRAM) will contain a random value. Accordingly, when the device is powered up, it is possible to have several transmission gates 4 on the same horizontal track 3 being active at the same time. This leads to a situation where several vertical (or driver) tracks 2 are connected to a single horizontal (or load) track 3, which situation is to be avoided for the reasons outlined above.

In order to avoid this situation, prior art device have used decoder signals in order to ensure that only a single transmission gate on any give track is active when the device is powered up. Such a device is shown in FIG. 3.

Figure 3:
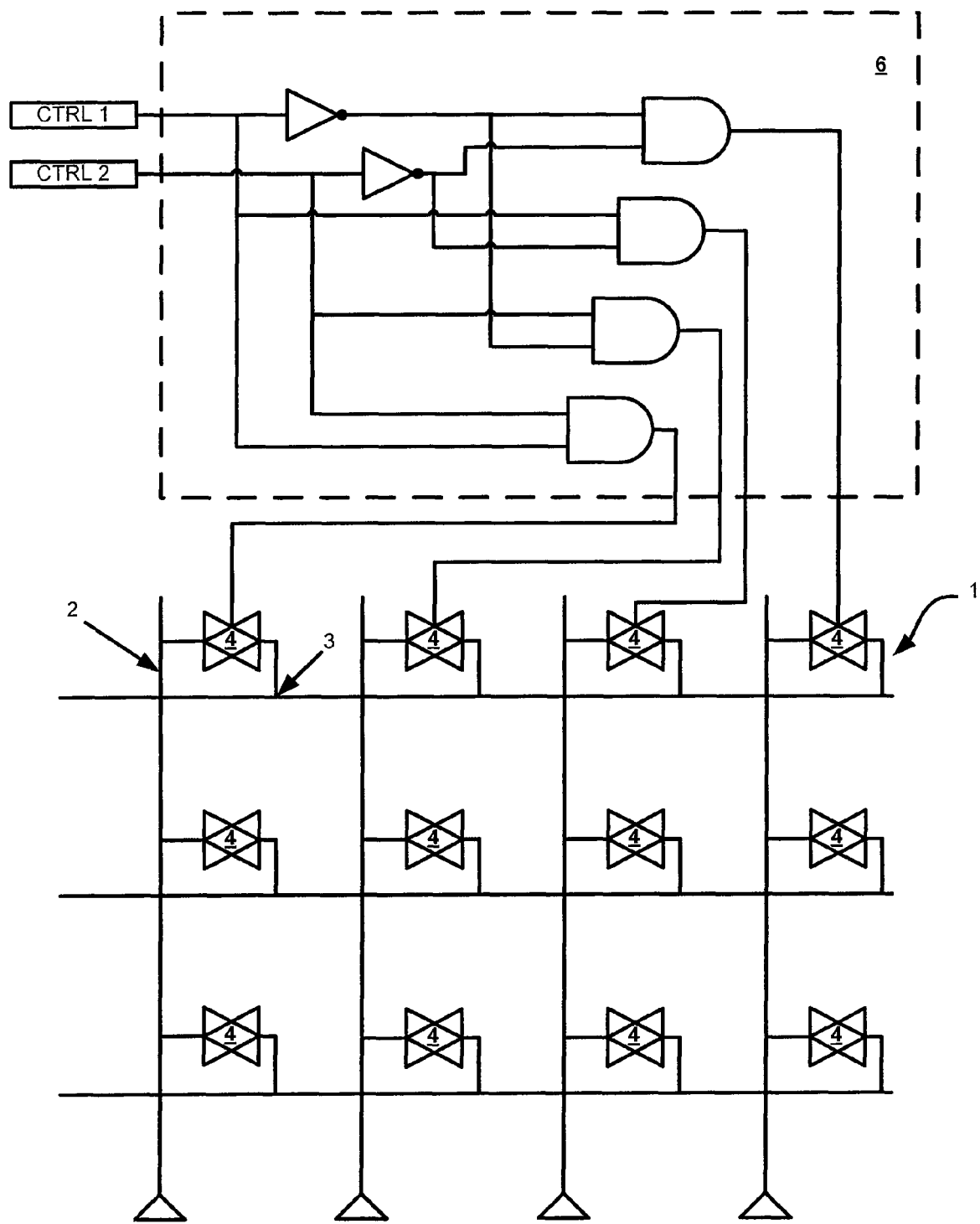
FIG. 3 is a diagram representing an interconnect in accordance with the prior art.

The device of FIG. 3 uses a decoder 6 in order to decode a two digit control signal (i.e. CTRL 1 and CTRL 2) into a single output. Thus, if the CTRL 1 is equal to a logical HIGH and CTRL 2 is equal to a logical HIGH, only the first transmission gate 4 (found on the top left hand side of the interconnect of FIG. 3) will be activated. Each of the other three transmission gates in the first horizontal row of the interconnect 1 will receive a logical LOW from the decoder 6 and will therefore be switched off. The values of CTRL 1 and CTRL 2 can be stored in an SRAM and, although their values will affect which transmission gate 4 will be active upon start up, only one transmission gate 4 can be active when the device is started up, regardless of the values stored in the SRAM. Accordingly, the decoder 6 will act as a control circuit which will ensure that only one transmission gate 4 per horizontal track 3 is active when the device is powered up.

As mentioned above, these types of devices suffer significant disadvantages in terms of scalability and complexity.

Figure 4:
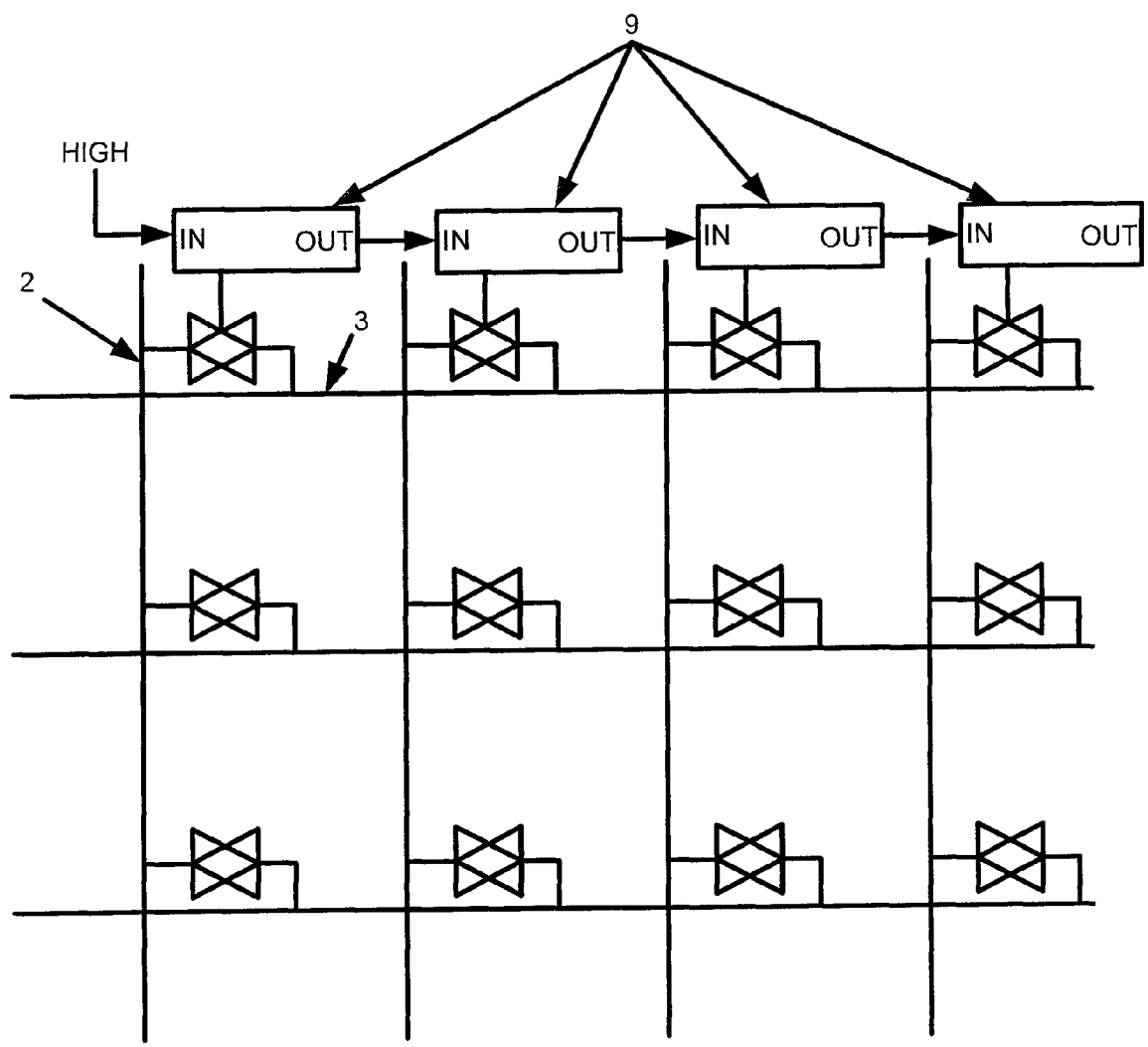
FIG. 4 is a diagram representing an interconnect in accordance with the present invention.

FIG. 4 is a device in accordance with the present invention. As can be seen from FIG. 4, each transmission gate controller 9 comprises an input (IN) and an output (OUT), the output of each transmission gate controller 9 being connected to the input of the following transmission gate controller 9 on the track, thereby forming a chain of transmission gate controllers 9. The input of the first transmission gate controller 9 in a chain will always be set to a logical HIGH, as shown on FIG. 4. Because each transmission gate controller 9 is identical and functions independently of the number of transmission gate controllers 9 in the chain, transmission gate controllers 9 can easily be added or removed from the chain, thereby resulting in a device which is easily scalable. In the example of FIG. 4, only the first horizontal (or load) track 3 is fitted with a device in accordance with the present invention. It should be clear however that any number of horizontal (or load) tracks 3 in the array could be fitted with a device in accordance with the present invention, the number of horizontal tracks 3 using a device in accordance with the present invention being dependant on the design of the logic circuit.

Figure 5:
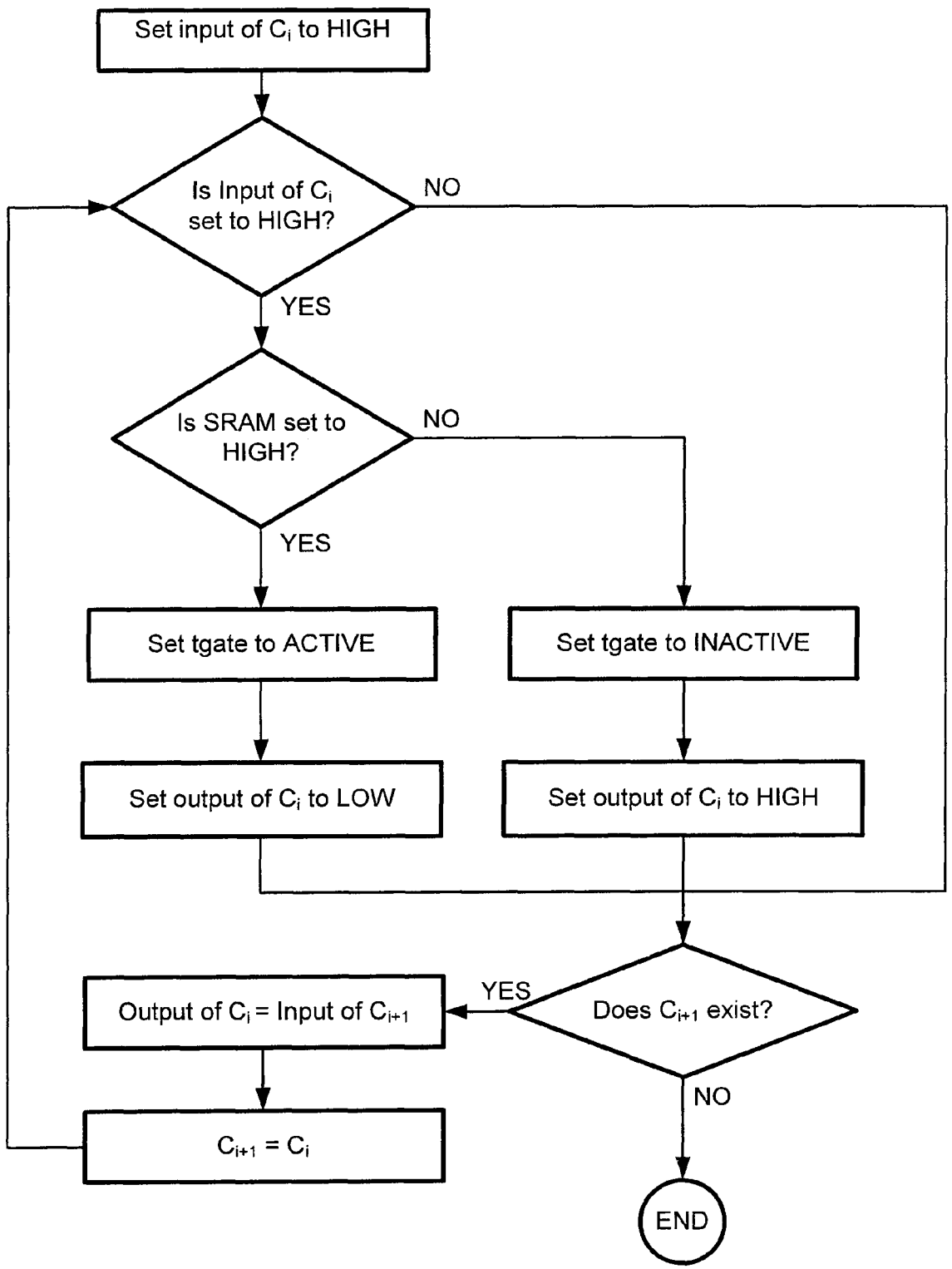
FIG. 5 is a flow chart representing the method in accordance with an embodiment of the present invention.

FIG. 5 is a flow chart representing the method of the present invention. The first step of the method comprises setting the input of the first transmission gate controller 9 to HIGH.

The second step of the method comprises determining whether the input of the transmission gate controller 9 is set to HIGH. If it is, then the method proceeds to the third step. If it is not, then the method proceeds to the fourth step.

The third step of the method comprises determining whether the SRAM is set to HIGH. If the SRAM is set to HIGH, the transmission gate 4 is switched on and the output of the transmission gate controller 9 is set to LOW. If the SRAM is set to LOW, the transmission gate 4 is switched off and the output of the transmission gate controller 9 is set to HIGH.

The forth step in the method comprises determining whether another transmission gate controller exists in the chain. If another transmission gate controller exists in the chain, the output of the current transmission gate controller 9 is propagated to the input of the next transmission gate controller 9 and the method is repeated, starting at the second step. If however no more transmission gate controllers 9 exist in the chain, the method ends.

Now, with reference to FIG. 6, a transmission gate controller 9 in accordance with a first embodiment of the present invention will now be described.

Each transmission gate controller 9 comprises an input (IN), an output (OUT) and some form of memory, in this case, SRAM. The value kept in the SRAM will, in part, determine the operational state of the transmission gate 4. In this example, for the transmission gate 4 to be activated, the SRAM must be set to 1.

The input (IN) is connected to a second input of the two-input AND gate 10 and the second input of the two-input AND gate 14. The output of the SRAM is connected to the first input of the AND gate 10. The output of AND gate 10 is connected to the input of inverter 12 and the input the transmission gate 4. The outputs of inverter 12 is connected to the first input AND gate 14. The output of AND gate 14 is connected directly to the output (OUT) of the transmission gate controller 9.

With reference to the truth table of FIG. 7, the operation of the transmission gate controller 9 of FIG. 6 will now be described.

When the input of the of the transmission gate controller 9 is set to logical LOW and the SRAM is set to logical LOW, the transmission gate will not be active (i.e. set to logical LOW) and the output (OUT) will be set to logical LOW. Thus, the transmission gate will not be active (i.e. the intersecting horizontal and vertical tracks will not be connected together) and, because the input of the next transmission gate controller 9 is directly connected to the output (OUT), the input (IN) of the next transmission gate controller 9 will be set to logical LOW.

Figures 6, 7:
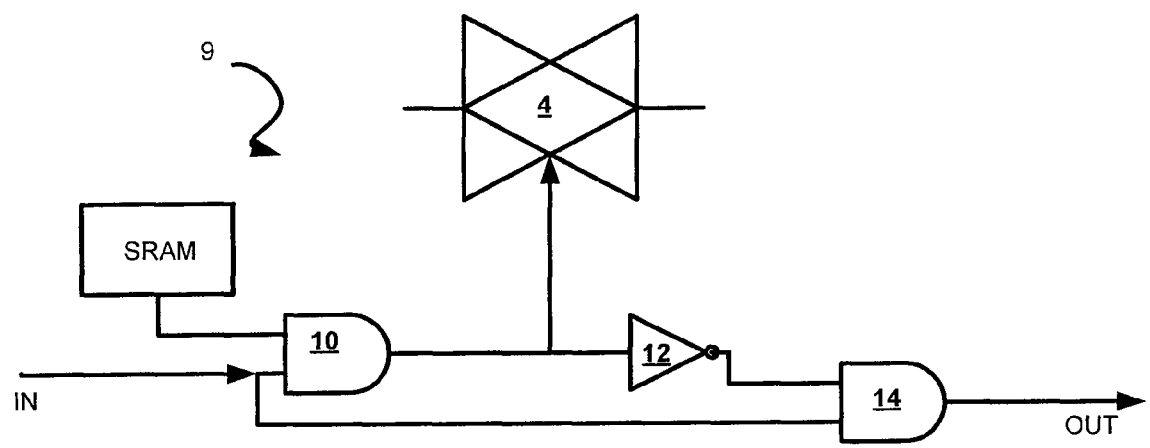
FIG. 6 is a diagram representing a transmission gate control circuit in accordance with an embodiment of the present invention.
FIG. 7 is the truth table of the circuit of FIG. 6.

Now, with reference to the second line in the table of FIG. 7, if, for example, the next transmission gate controller 9 has a logical HIGH stored in its SRAM, the output (OUT) of that transmission gate controller 9 will be set to logical LOW and the transmission gate 4 itself will not be activated.

Accordingly, once the output (OUT) of a transmission gate controller 9 is set to logical LOW, that value will propagate along the entire chain and prevent any of the transmission gates 4 from being activated. Because of this, the first input (IN) in the track is set to logical HIGH. Thus, if the SRAM of the first transmission gate controller 9 is set to logical LOW, as shown on the third line of the table of FIG. 7, the transmission gate 4 will be set to logical LOW and the output (OUT) will be set to logical HIGH. Accordingly, the logical HIGH value will be propagated along the chain of transmission gate controllers 9 until it reaches a transmission gate controller having an SRAM set to logical HIGH, at which point, as shown in the fourth line of the table of FIG. 7, the transmission gate 4 of the transmission gate controller 9 whose SRAM value is logical HIGH will be activated by being set to logical HIGH and the output (OUT) of that same transmission gate controller 9 will be set to logical LOW. As described above, the logical LOW at the output of that transmission gate controller 9 will then propagate along the rest of the chain and inhibit all remaining transmission gates controllers 9 from setting their respective transmission gates to a logical HIGH.

Accordingly, when using a device in accordance with the first embodiment of the present invention, only a single transmission gate on any one track can be activated on power up.

Figure 8:
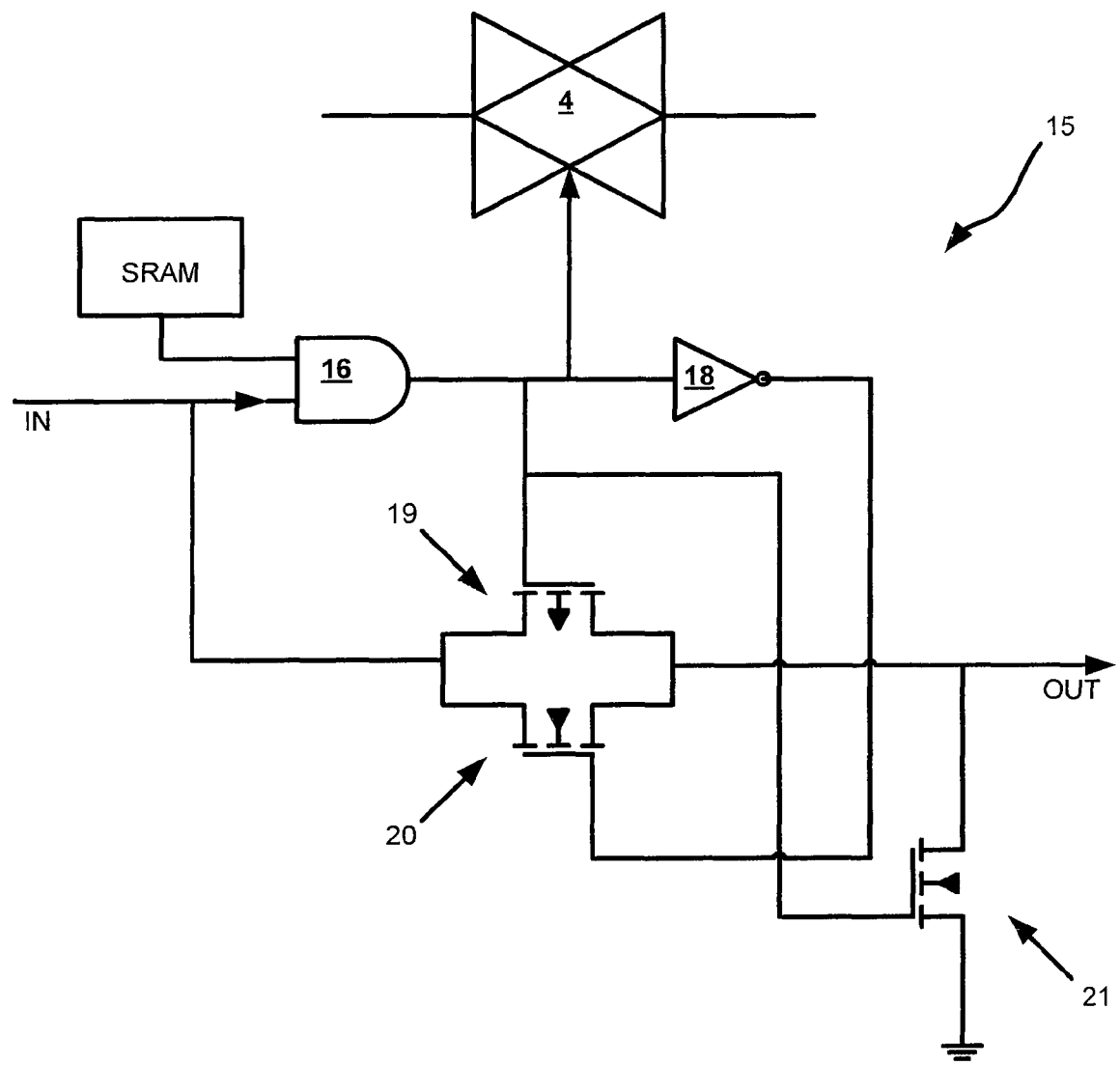
FIG. 8 is a diagram representing a transmission gate control circuit in accordance with another embodiment of the present invention.

FIG. 8 is a diagram representing a transmission gate controller 15 in accordance with a second embodiment of the present invention. The first input of the AND gate is connected to the output of the SRAM.

The input (IN) of the transmission gate controller 9 is connected to the second input of a AND gate 16, to the source of an P-channel transistor 19 and to the drain of an N-channel transistor 20, the source of the P-channel transistor 19 being connected to the drain of the N-channel transistor 20.

The output of the two input AND gate 16 is connected to the input of inverter 18, the gate of the P-channel transistor 19 and the gate of an N-channel transistor 21.

The output of the two input AND gate 16 is also connected to the transmission gate 4. The output of inverter 18 is connected to the gate of N-channel transistor 20.

As mentioned above, most current transmission gates comprise a parallel combination of nMOS and pMOS transistors (not shown), the control of which is effectuated by two complimentary signals. For the purposes of clarity however, a single control signal has been used throughout the description. A simple way to provide the complementary value of the signal controlling the transmission gate 4 in FIG. 8 is to use the output of inverter 18.

The drain of the P-channel transistor 19 is connected to the source of N-channel transistor 20, the drain of N-channel transistor 21 and the output (OUT) of the transmission gate controller 9. Finally, the source of the N-channel transistor 21 is connected to ground.

As will be appreciated, although the circuit in accordance with the second embodiment of the present invention comprises fewer components than the circuit in accordance with the first embodiment of the present invention, it will comply with the truth table of FIG. 7 and will therefore effectively operate in the same manner as the circuit in accordance with the first embodiment of the present invention. Accordingly, it will provide the same advantages as that circuit, as well as providing the added advantage of being physically smaller and less complex.

The invention claimed is:

1. An apparatus for connecting a load track (3) of a programmable interconnect to a plurality of intersecting driver tracks (2) of the programmable interconnect, the apparatus comprising a chain of connection cells (9;15), each connection cell being operable to connect the load track of the programmable interconnect to an associated intersecting driver track, each cell comprising:

connection signal receiving means arranged to receive a connection signal;

activation signal receiving means arranged to receive an activation signal;

connection means arranged to connect the load track of the programmable interconnect to the associated intersecting driver track of the programmable interconnect when the connection signal receiving means has received a connection signal and the activation signal receiving means has received an activation signal; and activation signal propagating means arranged to propagate the activation signal to the next cell in the chain when the connection signal receiving means has not received a connection signal and the activation signal receiving means has received an activation signal.

2. The apparatus according to claim 1, wherein the connection signal receiving means receives a connection signal from a memory device.

3. An apparatus in accordance with any of the preceding claims, wherein the connection means comprises a transmission gate (4).

4. The apparatus of claim 3, wherein:
the connection signal receiving means and the activation signal receiving means comprise first and second inputs of a logical AND gate (10), respectively;
the output of the logical AND gate is connected to a control input of the transmission gate (4) and to the input of a logical inverter (12);
the output of the logical inverter (12) is connected to the first input of a second logical AND gate (14);
the activation signal means is connected to the second input of the second logical AND gate; and
the output of the second logical AND gate is connected to the activation signal receiving means of the next cell in the chain.

5. The apparatus according to claim 3, wherein:
the connection signal receiving means and the activation signal receiving means comprise first and second inputs of a logical AND gate (16), respectively;
the output of the logical AND gate is connected to a control input of the transmission gate (4), to the input of a logical inverter (18), to the gate of an P-channel transistor (19) and to the gate of a first N-channel transistor (21);
the output of the logical inverter is connected to the gate of a second N-channel transistor (20);
the activation signal means is connected to the source of the P-channel transistor and to the drain of the second N-channel transistor;
the source of the first N-channel transistor is connected to ground; and
the drain of the P-channel transistor and the source of the second N-channel transistor are connected to the drain of the first N-channel transistor and to the activation signal receiving means of the next cell in the chain.

6. A programmable interconnect comprising:
an apparatus in accordance with any of the preceding claims.

7. A reconfigurable device comprising:
a programmable interconnect in accordance with claim 6.

8. A method of connecting a load track (3) of a programmable interconnect to a plurality of intersecting driver tracks (2) of the programmable interconnect, the apparatus comprising a chain of connection cells (9;15), each connection cell being operable to connect the load track of the programmable interconnect to an associated intersecting driver track, the method comprising the steps of:
receiving a connection signal;
receiving an activation signal;
connecting the load track of the programmable interconnect to the associated intersecting driver track of the programmable interconnect if the connection signal and the activation signal are at predetermined values; and
propagating the activation signal to the next cell in the chain when the connection signal and the activation signal are at another predetermined value.

* * * * *